United States Patent
Hester et al.

(10) Patent No.: US 7,274,322 B2
(45) Date of Patent: Sep. 25, 2007

(54) SYSTEMS AND METHODS FOR AUTOMATIC GAIN CONTROL FOR MULTICHANNEL RECEIVERS

(75) Inventors: Jeffrey A. Hester, Issaquah, WA (US); Radde Majeed, Bothell, WA (US); Julia R. Baryl, Kirkland, WA (US)

(73) Assignee: Honeywell International Inc., Morristown, NJ (US)

( * ) Notice: Subject to any disclaimer, the term of this patent is extended or adjusted under 35 U.S.C. 154(b) by 165 days.

(21) Appl. No.: 11/161,163

(22) Filed: Jul. 25, 2005

(65) Prior Publication Data

US 2007/0018883 A1  Jan. 25, 2007

(51) Int. Cl.
G01S 7/34 (2006.01)

(52) U.S. Cl. .................. 342/92; 342/192; 342/195; 73/900

(58) Field of Classification Search ............ 342/92
See application file for complete search history.

(56) References Cited

U.S. PATENT DOCUMENTS

| | | | |
|---|---|---|---|
| 4,037,163 A * | 7/1977 | Nicholas | 327/331 |
| 4,144,533 A | 3/1979 | Van Hijfte et al. | |
| 5,339,454 A | 8/1994 | Kuo et al. | |
| 6,094,481 A * | 7/2000 | Deville et al. | 379/388.03 |
| 2003/0215033 A1 * | 11/2003 | Drapkin et al. | 375/345 |

FOREIGN PATENT DOCUMENTS

| | | |
|---|---|---|
| EP | 0600637 A1 | 6/1994 |
| GB | 2229333 A | 9/1990 |

* cited by examiner

Primary Examiner—Thomas H. Tarcza
Assistant Examiner—Matthew M Barker
(74) Attorney, Agent, or Firm—Black Lowe & Graham PLLC

(57) ABSTRACT

Apparatus and methods for performing automatic gain control in a radar system. One embodiment of the system includes an attenuator that controls gain of signals received from a radar receiver. A digital signal processor determines coarse gain correction based on digitized noise data for a plurality of channels, determines fine gain correction based on the residual error after the coarse gain, and determines frequency vs. gain curve correction based on the digitized noise data for a plurality of channels and a mathematical model of frequency gain across a noise spectrum for the radar system. The result of the processor is a gain control signal that is sent to the attenuator to perform hardware gain control and a channel specific scale factor for software gain control. In one embodiment, the processor generates the gain control signal during an inactive scan mode of the radar system.

10 Claims, 9 Drawing Sheets

SYSTEMS AND METHODS FOR AUTOMATIC GAIN CONTROL FOR MULTICHANNEL RECEIVERS

BACKGROUND OF THE INVENTION

Radar, digital communications, and other wireless systems require a precisely controlled gain in each channel to ensure a constant noise level. A fixed noise level is crucial for choosing thresholds that provide the desired balance between minimum signal detection and false alarms due to noise. The RDR-4000 radar system has a number of channels that operate over a 40 MHz bandwidth and requires that the noise level be controlled to 0.1 dB to maintain an acceptable false alarm rate. This is a difficult control problem given that the noise level can change by more than 1 dB on each scan due to tilt changes, numerous interfering signals, and the gain varying across the frequency band by up to 1 dB from the first to last channel. Furthermore, the total gain variation due to component variation, temperature changes, and multiple installation configurations is estimated at 8 dB in a worst case scenario. Typical approaches to this problem are channelized solutions which are not as efficient or even practicable for a large number of channels given the time constraints.

Therefore, there exists a need for controlling the noise level across all the channels.

BRIEF SUMMARY OF THE INVENTION

The present invention includes apparatus and methods for performing automatic gain control in a radar system. One embodiment of the system includes an attenuator that controls signal gain. A digital signal processor determines coarse gain correction based on digitized noise data for a plurality of channels, determines fine gain correction based on residual error after the coarse gain correction, and determines frequency vs. gain curve correction based on the digitized noise data for a plurality of channels and a mathematical model of frequency gain across a noise spectrum for the radar system. The result of the processor is a gain control signal that is sent to the attenuator to perform gain control and a unique scale factor applied to the data for each frequency channel.

In one embodiment, the processor generates the gain control signal and scale factors during an inactive scan mode of the radar system.

BRIEF DESCRIPTION OF THE SEVERAL VIEWS OF THE DRAWING

The preferred and alternative embodiments of the present invention are described in detail below with reference to the following drawings.

DETAILED DESCRIPTION OF THE INVENTION

Figure 1:
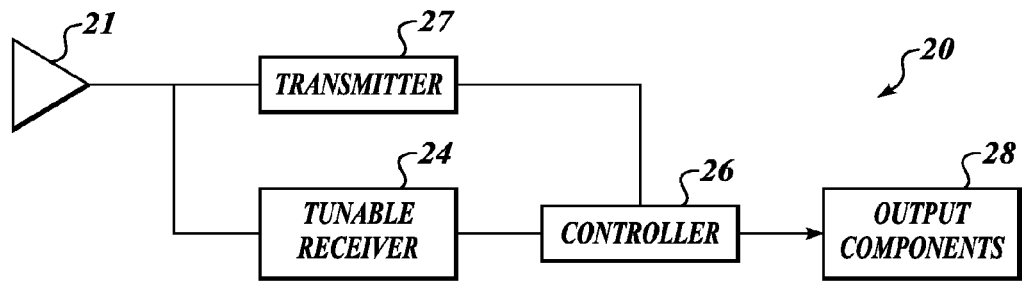
FIGS. 1 and 2 are block diagrams of systems formed in accordance with the present invention.

FIG. 1 illustrates an automatic gain control system 20 formed in accordance with an embodiment of the present invention. The system 20 includes transmit and receive antenna 21, a tunable receiver 24, a transmitter 27, a controller 26, and various output components 28. The controller 26 sends multi-channel signals to the transmitter 27 that are emitted via the transmit antenna 21 during an active scan mode. Also during the active scan mode, the receive antenna 21 receives reflections of the signal transmitted via the transmit antenna 21 and sends those received signals to the tunable receiver 24. The tunable receiver 24 sends the received signal to the controller 26 for processing and output to various output components 28.

During an inactive scan mode, the transmitter 27 is placed in an off condition (no transmit) and the controller 26 performs an analysis of system noise experienced by the receiver 24. The controller 26 automatically generates gain control signals based on the analysis and uses the automatic gain control signals when processing signals during the active scan mode of operation, thus producing better output data for the output components 28. The tunable receiver 24 receives a tuning signal from the controller 26 to select a frequency channel for the incoming signal data.

Figure 2:
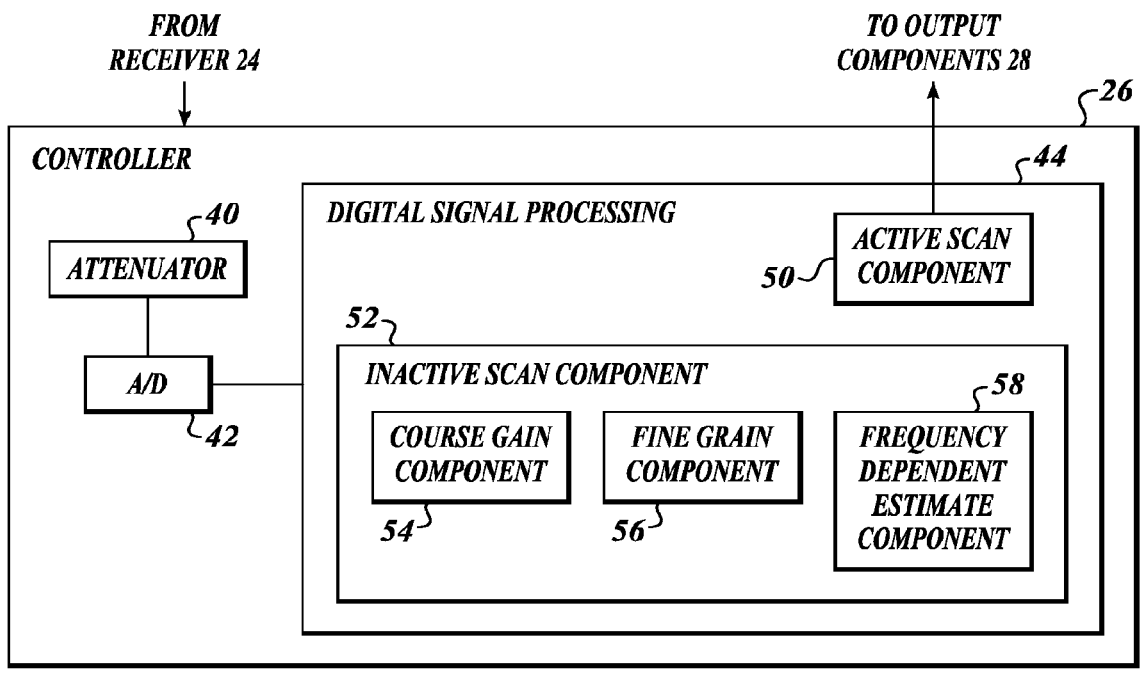

FIG. 2 illustrates example components included within the controller 26. The controller 26 includes an attenuator 40, an analog to digital (A/D) converter 42, and a digital signal processor 44. The digital signal processor 44 includes an active scan component 50 and an inactive scan component 52. The active scan component 50 performs digital signal processing on signals received from the receiver 24 during the active scan mode. The inactive scan component 52 performs analysis of system noise using a coarse gain component 54, a fine gain component 56, and a frequency dependent estimate component 58.

Figure 3:
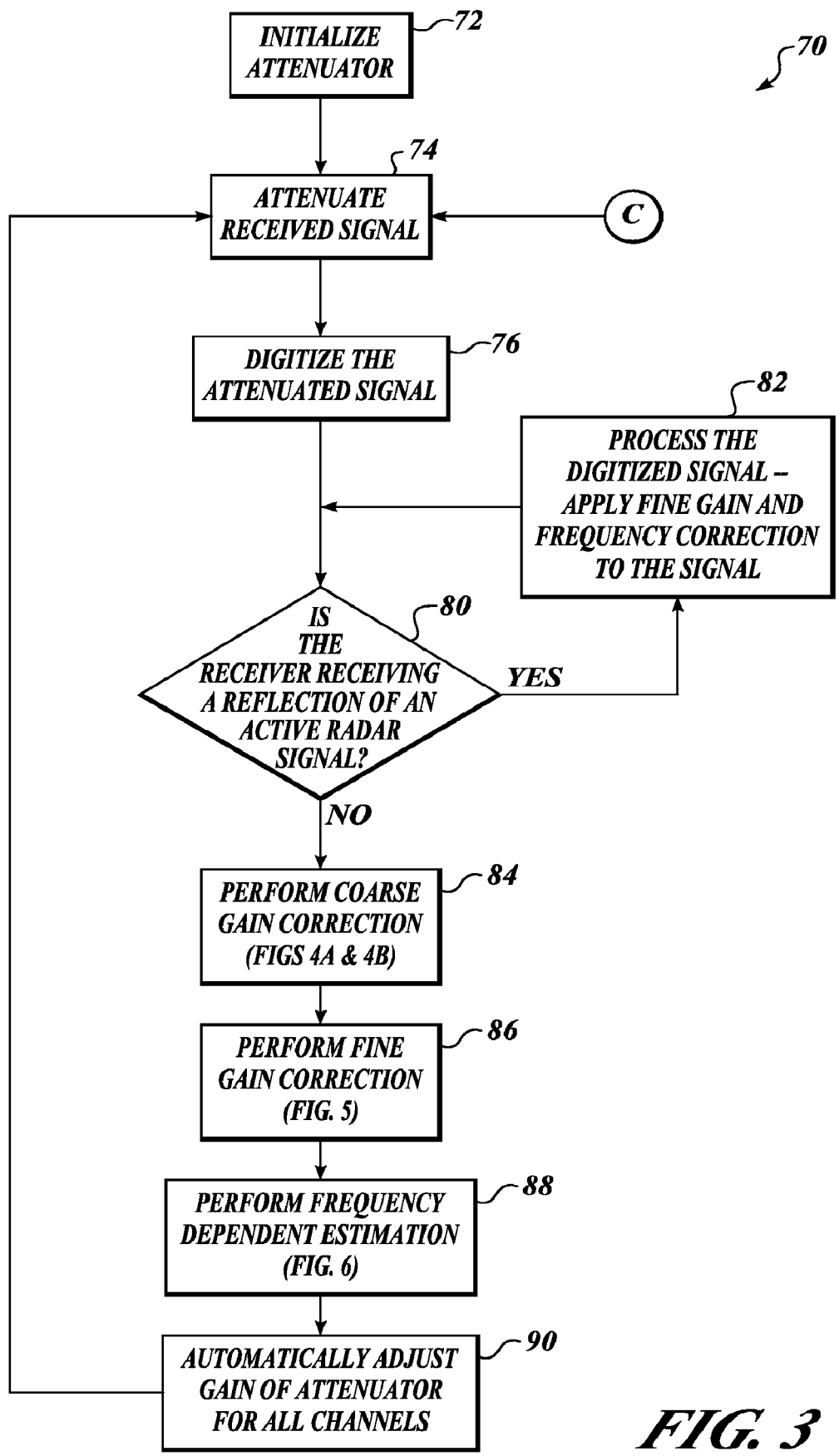
FIGS. 3-6 are flow diagrams of example processes performed by the systems of FIGS. 1 and 2.

FIG. 3 illustrates an example process 70 performed by the controller 26. First at a block 72 in one embodiment, the attenuator 40 is initialized to 8 dB which is the nominal design setting to achieve the target noise power of 100 dBL and provides enough range to increase or decrease the attenuation as needed. At a block 74, the signal is received and attenuated based on the previous setting. The attenuator value is set during the inactive scan mode and held at that value during the subsequent active scan mode.

Next, at a block 76, the attenuated signal is digitized at the A/D converter 42. At a decision block 80, a determination is made as to whether the system 20 is in an active scan mode or inactive scan mode. If at the decision block 80, the receiver 24 is receiving a reflection of an active radar signal, then the system 20 is in the active scan mode and the active scan component 50 processes the digitized signal at a block 82. Processing includes applying determined fine gain and frequency correction to the received signal. During the active scan mode the active scan component 50 detects reflected radar signals, analyzes the information, and generates a display for a variety of operating modes.

If at the decision block 80, the received signal is not a reflection of an active radar signal, then at a block 84, a coarse gain correction value is determined by the coarse gain component 54 (see FIG. 4). Next, at a block 86, a fine gain correction is performed on the received signal by the fine gain component 56 (see FIG. 5). At a block 88, after fine gain correction is performed, then frequency dependent estimations are performed by the frequency Dependent Estimate component 58 (see FIG. 6). Upon completion of steps performed at the blocks 84-88, gain at the attenuator for all the channels is automatically adjusted and frequency dependent scale factors are determined and set for each channel at block 90. The process then returns to the block 74 for attenuation of a received radar signal in the active and inactive scan mode.

Figure 4A:
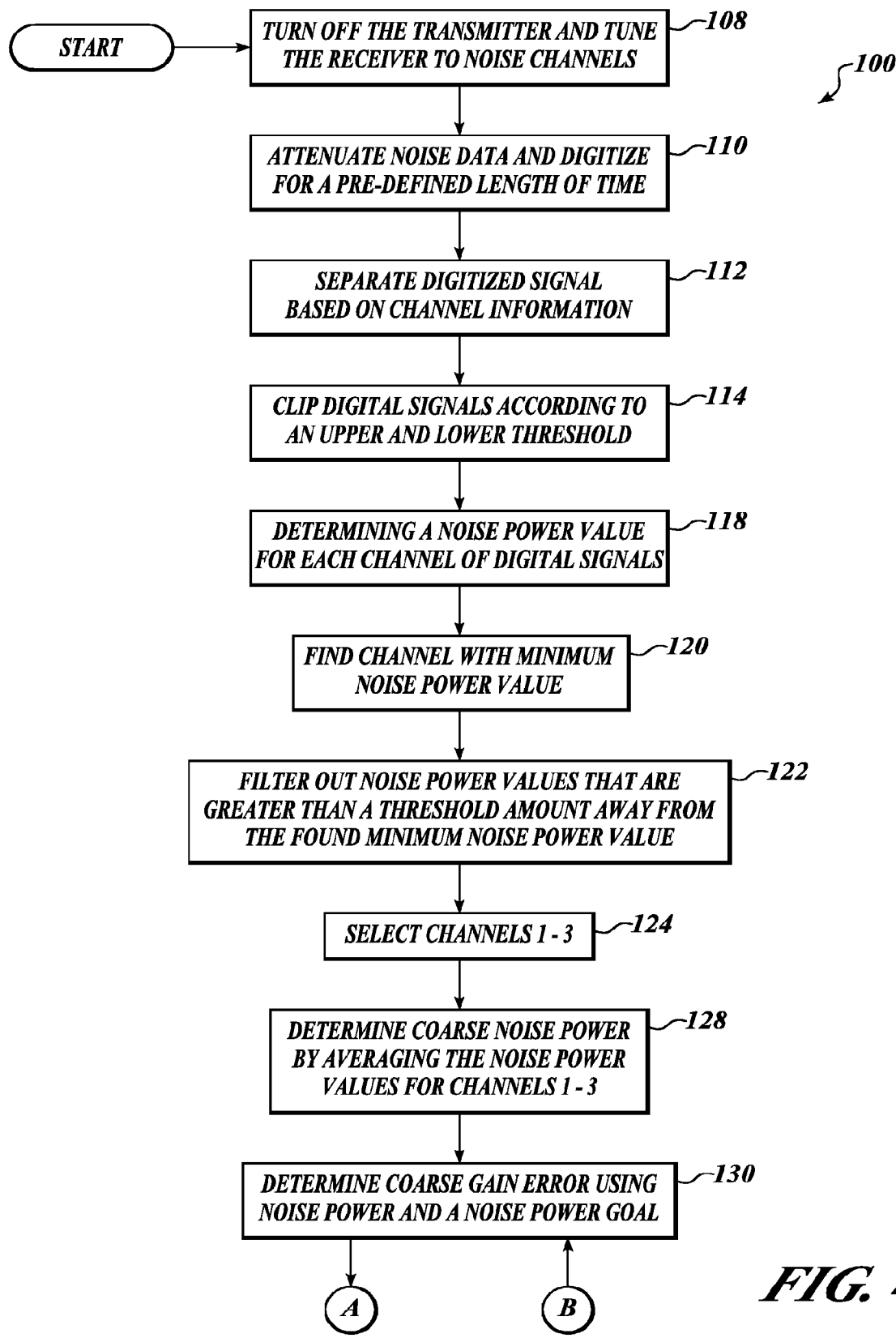
Figure 4B:
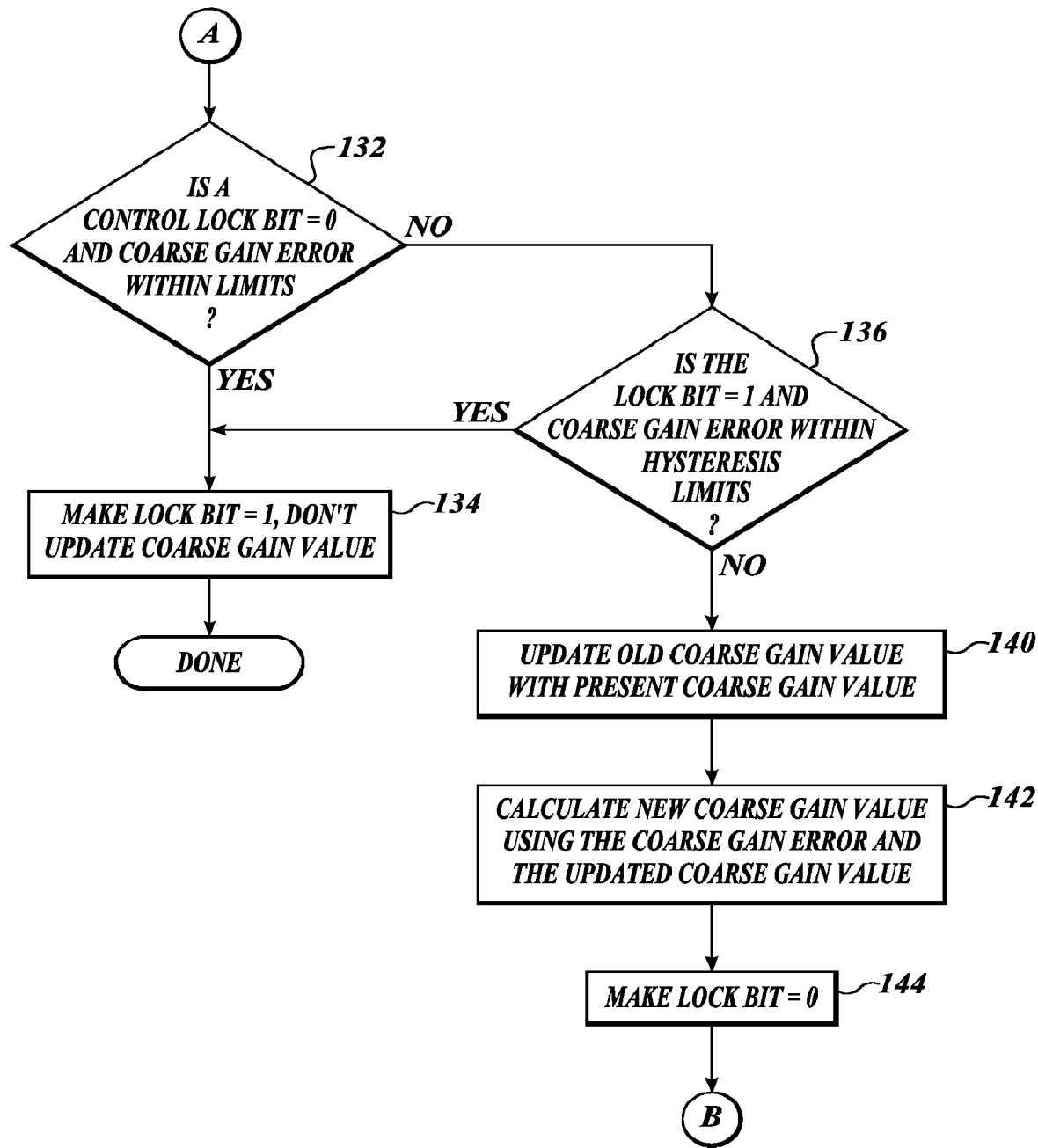

FIGS. 4A and 4B illustrate an example process 100 for performing coarse gain correction shown in the block 84 of FIG. 3. First at a block 108, the transmitter 27 is turned off, if not already, and the receiver 24 is tuned to pre-defined noise channels. At a block 110, the signals received by the noise channels are attenuated and digitized for a pre-defined length of time. At a block 112, the digitized signal is separated based on the channel information. At a block 114, the separated digital signals are clipped according to previously defined upper and lower thresholds. At a block 118, a noise power value is determined at each of the digital signal channels. At a block 120, the process 100 automatically finds the channels with the minimum noise power value. At a block 122, the other noise power values that are greater than a threshold amount away from the found minimum noise power value are filtered out. At a block 124, channels 1-3 are selected. More or less than 3 channels can be selected. In this embodiment, channels 1-3 are selected in order to get a sampling of the noise power values at the lower channels. At a block 128, a coarse noise power value is determined by averaging the noise power values for channels 1-3. At a block 130, coarse gain error is determined using noise power and a noise power goal. The noise power goal is the power desired for each channel. In this example, the target value is 100dBL.

At a decision block 132, the process 100 determines if a control lock bit is set at zero and the coarse gain error is within pre-defined limits. If at the decision block 132 both conditions are satisfied, then at a block 134, the lock bit is made equal to 1 and the coarse gain value is not updated, thus completing coarse gain correction. If at the decision block 132, one or both of the conditions are not met, then the process 100 continues to a decision block 136 and determines if the lock bit is set at one and the coarse gain error is within hysteresis limits. The hysteresis limits are set slightly wider than the initial lock limits to prevent the coarse gain from contantly toggling between 2 states when the noise power is near the limit. This is desired because the coarse gain must remain stable once it has locked to allow the following stages to converge. If at the decision block 136 the conditions are met, the process 100 continues onto the block 134. If, however, one or both of the conditions are not met at the decision block 136, then at block 140, the previously stored coarse gain value is updated with the presently determined coarse gain value. At a block 142, a new coarse gain value is calculated using the coarse gain error and the updated coarse gain value. At a block 144, the lock bit is made equal to zero and the process returns to block 130.

Figure 5:
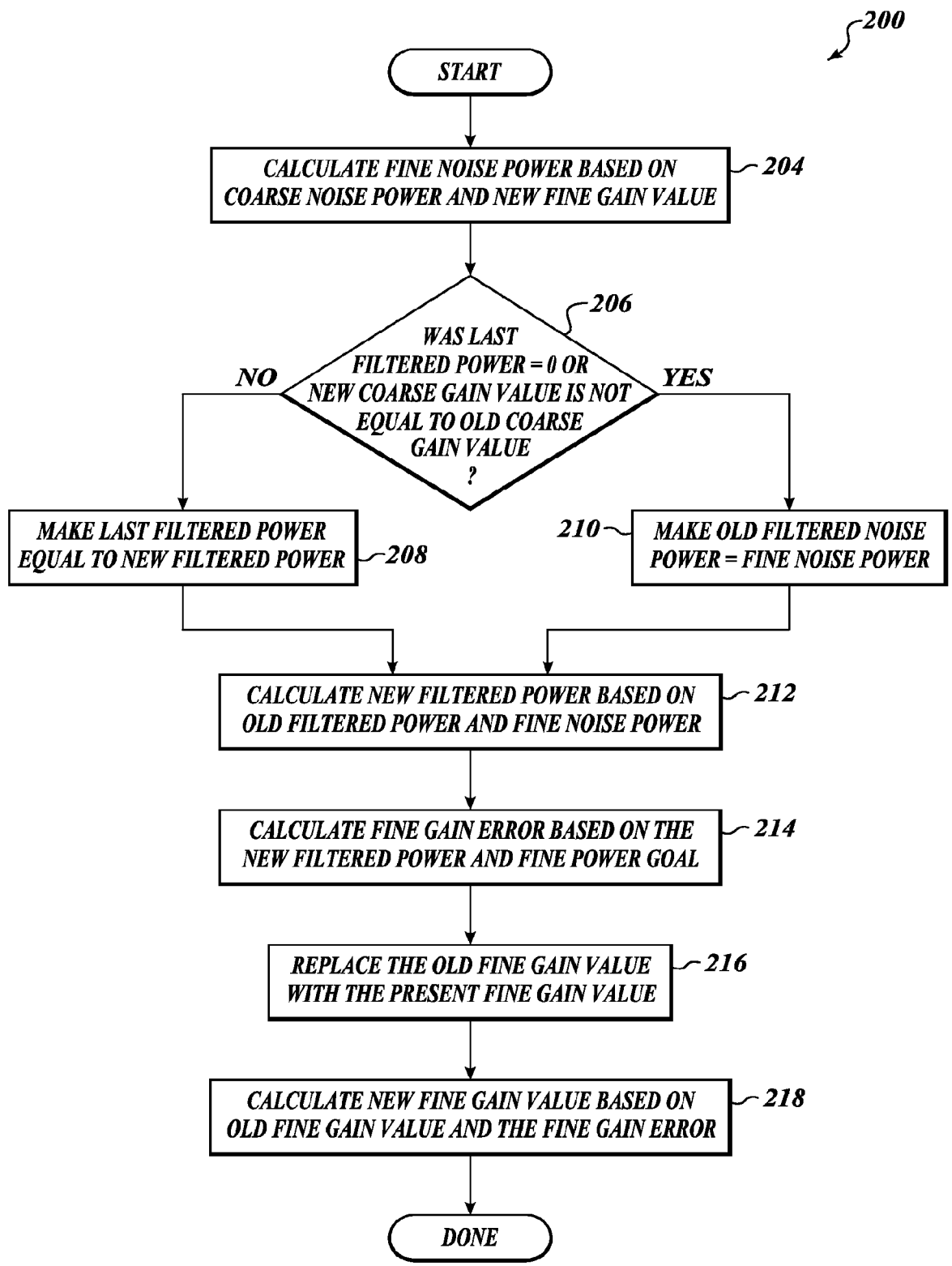

FIG. 5 illustrates a process 200, which is an example of the fine gain correction performed at the block 86 of FIG. 3. First, at a block 204, fine noise power is calculated based on the coarse noise power and a new fine gain value. If a new fine gain value has not been calculated at this point, then an initial fine gain value of 1.0 is used. At a decision block 206, the process 200 determines if the last filtered noise power was equal to zero or the new coarse gain value is not equal to the old coarse gain value. Filter noise power is initialized to fine noise power at power up (filtered power=0) or whenever the coarse gain changes. This is done subtly by initializing old filtered noise power to fine noise power and then calculating new filtered noise power as a percentage of old noise power plus a percentage of fine noise power. If both of the conditions of the decision block 206 are not met, then at a block 208, the last filtered power value is equal to the new filtered power value. If one of the conditions was met at the decision block 206, then at a block 210, the old filtered noise power value is equal to a fine noise power value. After blocks 208 and 210, the new filtered power value is calculated based on the old filtered power value and the fine noise power value (see block 212). At a block 214, a fine gain error value is calculated based on the new filtered power and a fine power goal. The fine power goal is the desired target. In this example the fine power goal is 100 dBL. At a block 216, the old fine gain value is replaced with the present fine gain value. At a block 218, a new fine gain value is calculated based on the old fine gain value and the fine gain error value.

Figure 6:
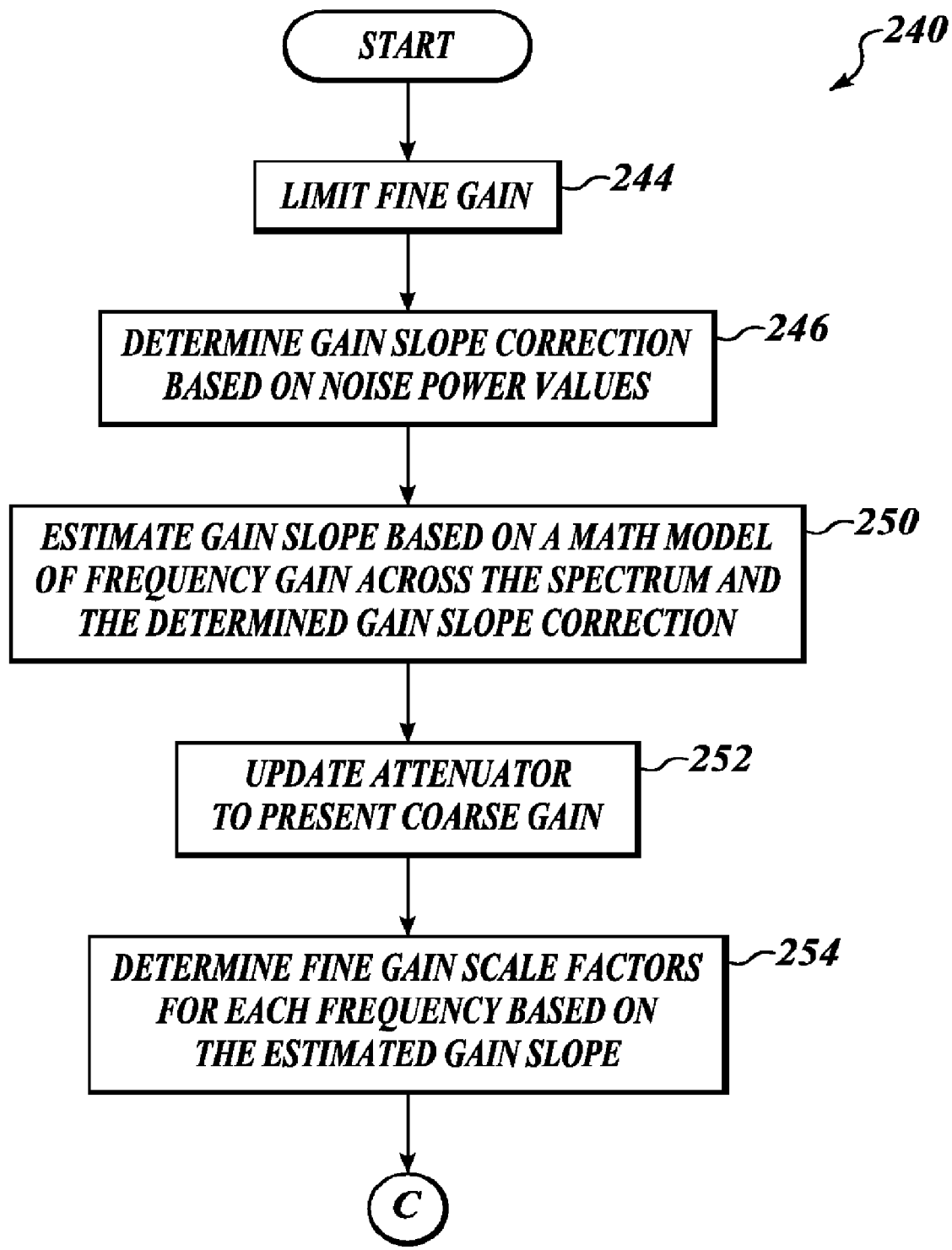

FIG. 6 illustrates example process 240 for performing the frequency dependent estimation as performed at the block 88 of FIG. 3. First at a block 244, fine gain is limited to 0.5 to 2.0. Larger values than this are considered out of range because if the coarse gain is working correctly, the residual error left for the fine gain to correct will be between 0.75 and 1.25. Next, at block 246, the frequency vs. gain slope (or general function) is measured based on noise power values taken at multiple frequency channels. At a block 250, these measurements are used over time to estimate the parameters of a predetermined mathematical model of the system frequency response across the spectrum and then determine the gain correction as a function of frequency. At a block 252, the digital attenuator is updated using the present coarse gain value. Then at a block 254, fine gain scale factors are determined for each frequency based on the estimated gain slope (or general function). Process 240 then returns to the block 74 of FIG. 3 and will repeat the process until the system switches to the active scan mode.

EXAMPLE

Figure 7:
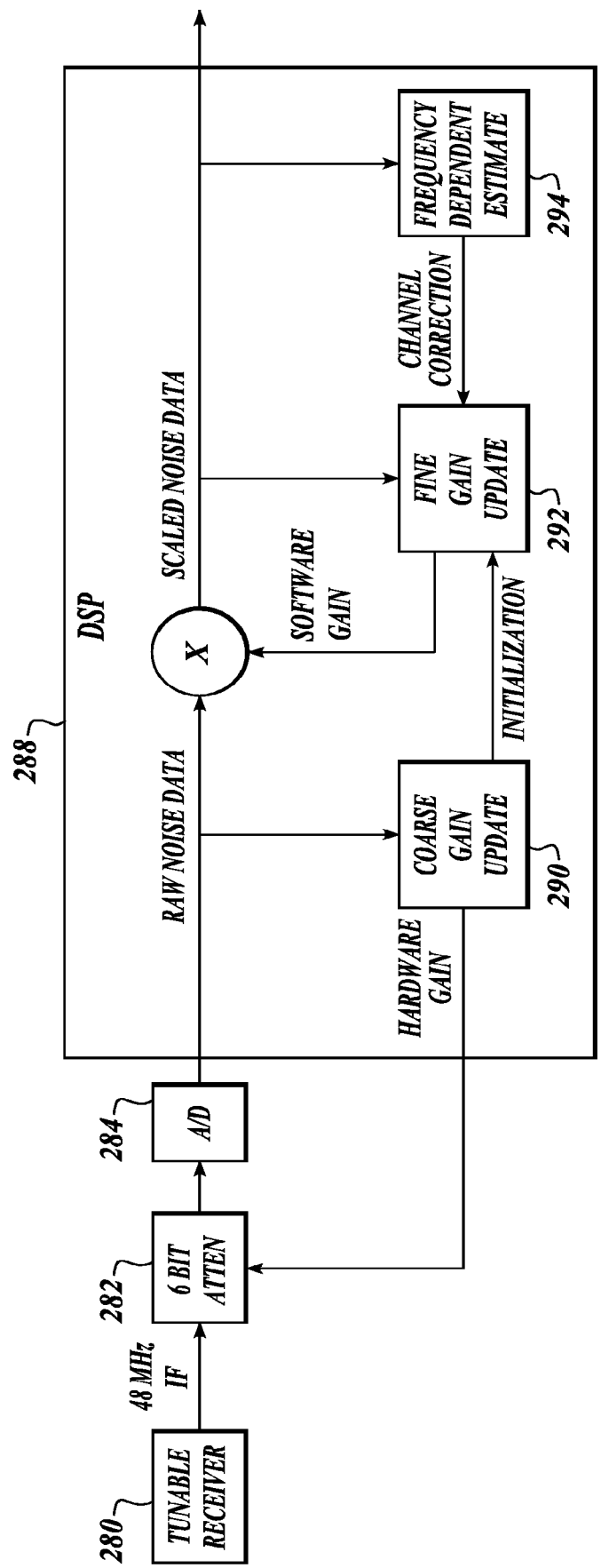
FIG. 7 is a block diagram of an example system formed in accordance with the present invention.

FIG. 7 illustrates a more detailed process/system implemented in an RDR-4000 weather radar produced by Honeywell, Inc. This automatic gain control process starts by making an accurate measurement of the noise power that is used to drive gain control loops. All noise sampling and updates are done during a short period at the end of each antenna scan. During this short period (100 to 400 milliseconds), the transmitter is turned off and the receiver 280 is randomly tuned among 4 frequency channels to record sets of noise data with 4096 digital samples each. When 8 sets of noise samples are collected they are passed to a control algorithm. The number of channels used, samples per set, and number of sets are all selectable parameters that can be optimized for a specific application. The data is first scanned sample by sample to detect interfering signals that often corrupt the noise data. Anytime the power in an individual sample exceeds a threshold greater than the expected noise power this sample is replaced by a nominal value because it is assumed to contain interference. The next step calculates noise power of each corrected set of samples and discards outlier sets where excessive interference was not detected and corrected in the previous step. Finally, the remaining sets are sorted and averaged according their channel. Three adjacent 'primary control channels' at the low end of the frequency spectrum are averaged together into a single data metric, IqVarC. Using 3 channels provides frequency diversity as another layer of protection against interference in case an entire channel is wiped out from an interference source.

The first stage in the RDR-4000 in a digital signal processor (dsp) 288, the coarse gain update 290 uses the IqVarC estimate of noise power in a control loop with a 6 bit/0.5 dB step digital attenuator 282 in front of an analog to digital converter 284 to adjust the hardware gain. Once the noise power is controlled to within 0.5 dB of the target value the coarse gain loop is "locked" and will not change states unless the error is greater than 1.0 dB away from the target. This hysteresis is used to keep the coarse gain at a fixed value and prevent it from constantly toggling between states above and below the target value. A stable coarse gain allows the following stages to converge, and it satisfies the objective of the hardware stage to limit the A/D noise figure contribution by maintaining the noise power into the A/D at a fixed power level above A/D self noise. (In the RDR-4000, 10.5 dB +/−1.0 dB above A/D self noise was chosen).

The next stage, the fine gain update 292, is a software gain control loop that receives the signal with the residual error from the coarse gain stage as the input and further controls the output noise power to within +/−0.1 dB of the target by applying a software scale factor to the signal. The coarse gain must first settle and lock before the fine gain stage becomes active. Once locked, an estimate of the coarse residual error is used to initialize the fine gain stage. The fine gain setting becomes invalid each time the coarse control is changed, so estimating the new value of fine gain allows the system to converge faster. The first two stages measure and control time variations in system noise power and converge to a new optimal gain setting for each scan.

The third stage, the frequency dependent estimate 294 provides corrections for channel to channel system frequency response. These corrections are not time varying, therefore, this stage is allowed to converge slower leaving more resources dedicated to the first two stages which are time critical. This stage includes a system estimator based on a model of the system frequency response which is determined during the design phase. A Kalman filter (or another estimation technique) is used to estimate the model parameters over time and obtain the gain as a function of frequency. The model is configured to receive inputs as a ratio of noise power from various points in the frequency spectrum divided by the noise power of the primary control channel(s). The noise power on any channel may vary greatly with time, but at any given time the ratio between 2 channels remains fixed based on the system frequency response since the time-varying component cancels when the ratio is taken. This data is collected by periodically sampling the noise power on channels other than the primary control channel(s). For example, the RDR-4000 uses a simple linear model for the system, but higher order models may be used. The complexity of the system model chosen depends on the nature of the system and the desired accuracy of the control loop. The output of this stage is a system gain equation as a function of frequency which can be applied to the fine gain for any channel by knowing the center frequency of the channel.

Figure 8:
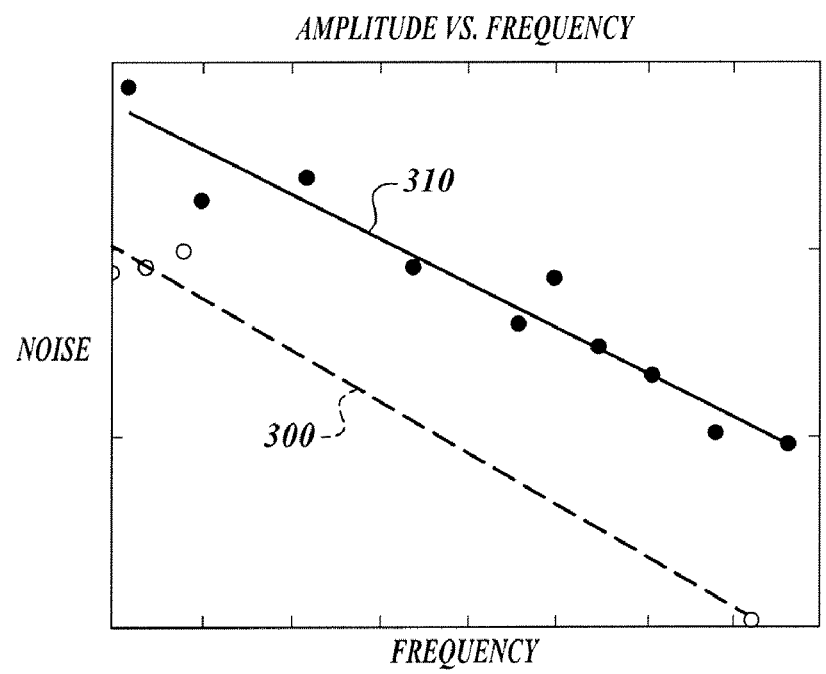
FIGS. 8-11 are graphs of intermediate and final results generated by the system of FIGS. 1, 2 and 7.

The last stage (294) compensates for the gain variation at different frequency channels. The first step in implementing this function is to mathematically characterize the shape of the system frequency response. This is done by collecting noise only measurements at each channel on a representative number of units. The average noise power at each channel is plotted against frequency (FIG. 8). There are two types of noise measurements taken in this test. One measurement occurs during the antenna turn-around where transmitter is turned off and the receiver is tuned to one of the four noise channels (21-24). The noise measurements are item 300—the 3 on the left side are channels 21, 22, and 23, respectively, and the one at the right side is channel 24.

The other type of measurement is taken during normal radar operation during the scan where the transmitter is terminated into a load so that no radar echos are produced (done for testing), and the receive signal contains only the noise power in that channel. This is shown as item 310 and contains data from a number of channels across the entire frequency band. Both sets of data are collected in an alternating fashion while the antenna is scanning from side to side and switching between noise collections at the turn around and regular operation during the middle of the scan. At the end, the data is averaged at each channel and plotted.

After running about 10 units, the shape of the spectrum magnitude is best modeled by a line with a negative slope. Second, there appears to be a bias between the data taken at the turn-around vs. the data taken while transmitting in normal operation, but the slopes are approximately the same. The bias between the two lines was determined to be caused by temperature differences when the system is transmitting during the scan vs. not transmitting at the turn around. This difference was modeled as a gain bias correction factor. Lastly, the slope varied unit to unit and very slowly over time, and therefore, must be determined during operation for each system.

One slope estimator is a Kalman filter and another is an Infinite Impulse Response (IIR) filter. Other estimators may be used. The input to each of these filters is an instantaneous measurement of the gain slope.

$$S(i)=[sqrt(IqVarEnd)-sqrt(IqVarC)]/(36-2)$$

$$Slope(i)=f(S(i))$$

Figure 9:
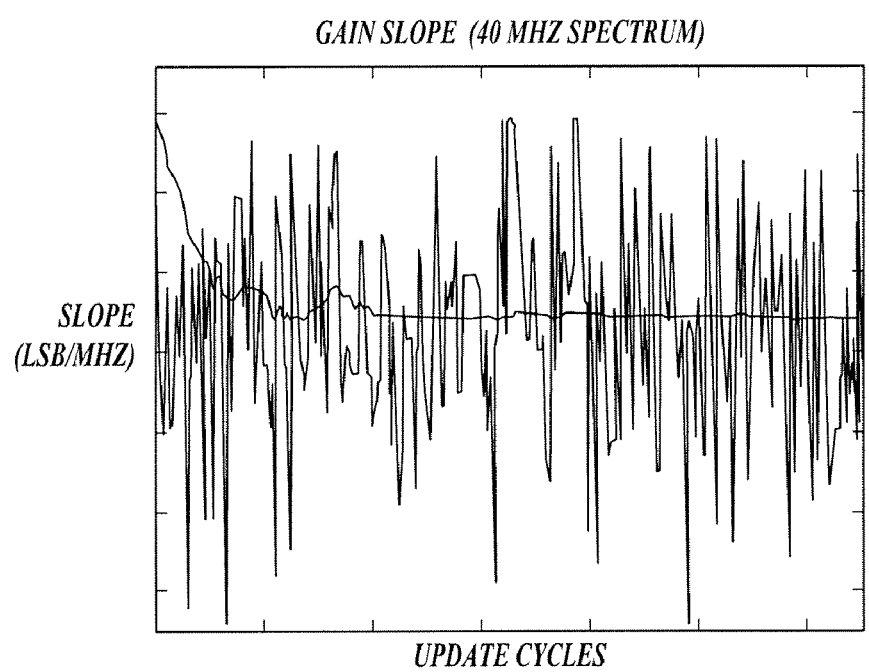
Figure 10:
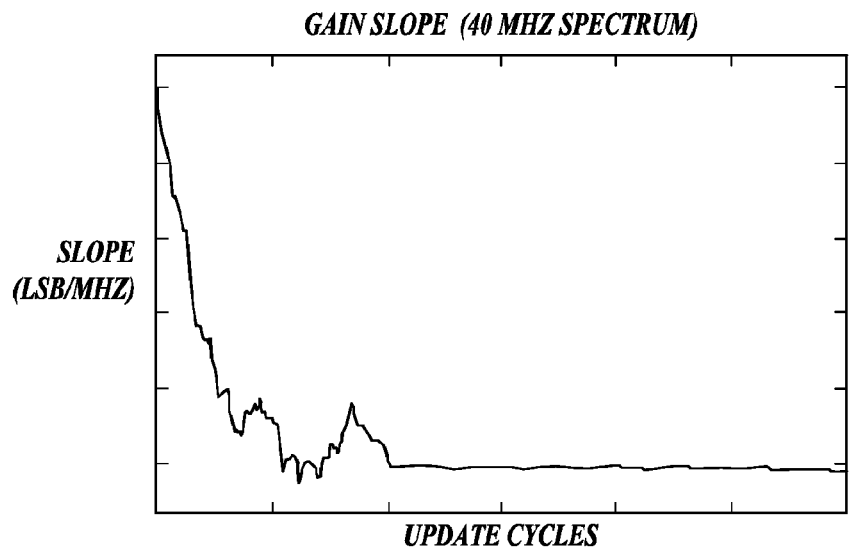

The output of the slope estimator is the best estimate of the current slope based on all the input data thus far. Since the instantaneous measurements are very noisy it takes awhile for the estimator output to converge to the correct value. FIG. 9 shows an example of the instantaneous measurements and the estimator output vs. time. The plot shows that it takes between 50 and 100 operating cycles of the algorithm for this value to converge. FIG. 10 shows the same plot with just the estimator output.

The last step is to apply the results to the data by compensating the gain at each channel. The slope calculated above is used to modify the gain as a function of frequency:

$$FineGain(freq)=0.9973*sqrt(Gfl)*10^5/(10^5+Slope*(freq-3))$$

Where:

FineGain—Noise amplitude gain as a function of channel frequency,

Gfl—current fine power gain value from SAGC stage 2 at freq=2 MHz,

Freq—relative channel frequency in Mega Hertz,

Slope—slope estimator output, 0.9973—gain bias correction to account for temperature differences when the transmitter is on.

Figure 11A:
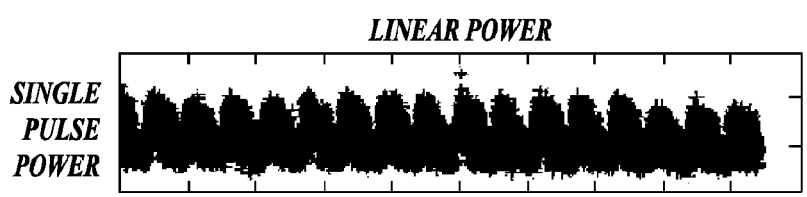
Figure 11B:
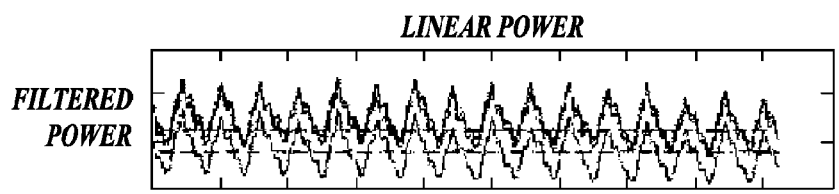
Figure 11C:
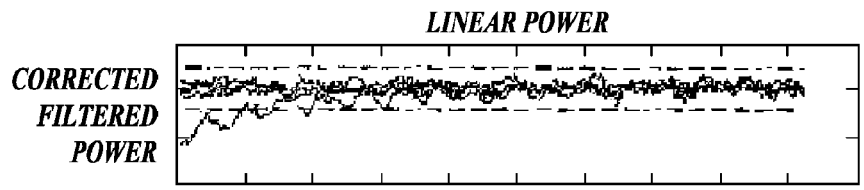

FIG. 11A shows the raw noise power without stage 2 or stage 3 corrections applied. The largest source of variation is due to antenna scanning cycles of which about 17 are shown. Stage 2 corrects for this effect as seen in FIG. 11B. A secondary effect is the channel to channel gain variation. FIG. 11C shows the variation during the first 100 cycles. However, as the slope estimator converges, the correction brings all the channel noise into specification.

While the preferred embodiment of the invention has been illustrated and described, as noted above, many changes can be made without departing from the spirit and scope of the invention. For example, the present invention may be implemented in a system that includes separate transmit and receive antennas. Accordingly, the scope of the invention is not limited by the disclosure of the preferred embodiment.

Instead, the invention should be determined entirely by reference to the claims that follow.

What is claimed is:

1. A method for performing automatic gain control in a radar system having a spectrum, the method comprising:
   a) determining coarse gain correction based on noise power measurements for a plurality of channels;
   b) determining fine gain correction based on residual error that exists after the coarse gain correction is determined;
   c) measuring noise power;
   d) determining frequency vs. gain curve correction based on the measured noise power for a plurality of channels and a mathematical model of frequency gain across the spectrum of the radar system; and
   e) automatically performing gain control according to the coarse gain correction, the fine gain correction, and the gain curve correction.

2. The method of claim 1, wherein a-d) are performed during an inactive scan mode of the radar system.

3. The method of claim 1, wherein a) comprises determining the channel having the lowest noise power value and filtering the other channels according to the determined channel.

4. The method of claim 3, wherein a) is further based on a noise power goal, and one or more coarse gain error limits.

5. The method of claim 1, wherein e) comprises performing gain control by adjusting an attenuator.

6. An apparatus for performing automatic gain control in a radar system having a spectrum, the apparatus comprising:
   an attenuator configured to control gain of signals received from a receiver; and a digital signal processor in data communication with the attenuator, the processor comprising:
   a first component configured to determine coarse gain correction based on noise power measurements for a plurality of channels;
   a second component configured to determine fine gain correction based on residual error that exists after the coarse gain correction is determined;
   a third component configured to measure noise power;
   a fourth component configured to determine frequency vs. gain curve correction based on the measured noise power for a plurality of channels and a mathematical model of frequency gain across the spectrum of the radar system; and
   a fifth component configured to send a control signal to the attenuator, wherein in the control signal causes the attenuator to perform gain control according to the outputs of the first, second and third components.

7. The apparatus of claim 6, wherein the first, second and third components operate during an inactive scan mode of the radar system.

8. The apparatus of claim 6, wherein the first component determines the channel having the lowest noise power value and filtering the other channels according to the determined channel.

9. The apparatus of claim 8, wherein the first component determines coarse gain correction further based on a noise power goal, and one or more coarse gain error limits.

10. The apparatus of claim 6, wherein the fifth component comprises performing gain control by adjusting the attenuator.

* * * * *